United States Patent
Shin et al.

(10) Patent No.: US 9,478,298 B2
(45) Date of Patent: Oct. 25, 2016

(54) MEMORY SYSTEM AND METHOD OF READING DATA THEREOF

(71) Applicant: SAMSUNG ELECTRONICS CO., LTD., Suwon-Si, Gyeonggi-Do (KR)

(72) Inventors: Hyun-Ho Shin, Hanam-Si (KR); Heung-Soo Lim, Yongin-Si (KR)

(73) Assignee: Samsung Electronics Co., Ltd., Suwon-si, Gyeongg-do (KR)

(*) Notice: Subject to any disclaimer, the term of this patent is extended or adjusted under 35 U.S.C. 154(b) by 76 days.

(21) Appl. No.: 14/312,214

(22) Filed: Jun. 23, 2014

(65) Prior Publication Data

US 2014/0380129 A1   Dec. 25, 2014

(30) Foreign Application Priority Data

Jun. 24, 2013  (KR) .................. 10-2013-0072708

(51) Int. Cl.
| | |
|---|---|
| *G11C 29/00* | (2006.01) |
| *G11C 16/26* | (2006.01) |
| *G11C 16/34* | (2006.01) |
| *G11C 29/52* | (2006.01) |
| *G06F 11/10* | (2006.01) |

(52) U.S. Cl.
CPC .......... *G11C 16/26* (2013.01); *G06F 11/1048* (2013.01); *G11C 16/34* (2013.01); *G11C 29/52* (2013.01)

(58) Field of Classification Search
CPC ....... G11C 16/26; G11C 16/34; G11C 29/52; G06F 11/1048
See application file for complete search history.

(56) References Cited

U.S. PATENT DOCUMENTS

| | | | | |
|---|---|---|---|---|
| 6,757,848 B2* | 6/2004 | Bartlett | ................ | G11B 20/18 360/53 |
| 7,308,567 B2* | 12/2007 | Yamamoto | .......... | G06F 11/1417 713/1 |
| 7,333,364 B2* | 2/2008 | Yu | ........................ | G11C 11/5621 365/185.09 |
| 7,765,426 B2* | 7/2010 | Li | ........................ | G06F 11/073 714/6.13 |
| 7,788,541 B2* | 8/2010 | Shellhamer | .......... | G06F 11/1076 714/42 |
| 7,831,881 B2 | 11/2010 | Eun et al. | | |
| 7,849,382 B2 | 12/2010 | Kasahara et al. | | |
| 7,861,122 B2* | 12/2010 | Cornwell | .............. | G06F 11/073 711/103 |
| 7,925,928 B2* | 4/2011 | Yamamoto | .......... | G06F 11/1417 713/2 |
| 8,149,618 B2 | 4/2012 | Kang | | |
| 8,169,825 B1* | 5/2012 | Shalvi | .................... | G11C 11/56 365/185.09 |
| 8,335,977 B2 | 12/2012 | Weingarten et al. | | |
| 8,508,991 B2* | 8/2013 | Yang | ................... | G11C 11/5642 365/185.03 |
| 8,984,375 B2* | 3/2015 | Hashimoto | ........... | G06F 11/004 714/47.2 |

(Continued)

FOREIGN PATENT DOCUMENTS

| | | |
|---|---|---|
| JP | 2004220068 | 8/2004 |
| KR | 1080191 | 11/2011 |
| KR | 1020120097963 A | 9/2012 |

*Primary Examiner* — Esaw Abraham
(74) *Attorney, Agent, or Firm* — Volentine & Whitt, PLLC

(57) ABSTRACT

A method of reading data in a memory system including a non-volatile memory device, includes reading first data stored in a first block using a first read scheme capable of detecting/correcting an error in the first data, and upon determining an uncorrected error in the first data, setting the first block as a first temporary bad block and reading second data stored in the first temporary bad block using a second read scheme different from the first read scheme.

15 Claims, 16 Drawing Sheets

(56) References Cited

U.S. PATENT DOCUMENTS

| | | | |
|---|---|---|---|
| 9,128,822 B2* | 9/2015 | Michael | G06F 12/0246 |
| 2007/0294588 A1* | 12/2007 | Coulson | G06F 11/1068 |
| | | | 714/42 |
| 2011/0231738 A1 | 9/2011 | Horisaki | |
| 2011/0280070 A1 | 11/2011 | Kim et al. | |
| 2012/0134207 A1 | 5/2012 | Yoon et al. | |
| 2012/0240007 A1 | 9/2012 | Barndt et al. | |
| 2014/0164868 A1* | 6/2014 | Haratsch | G06F 11/1012 |
| | | | 714/763 |

* cited by examiner

MEMORY SYSTEM AND METHOD OF READING DATA THEREOF

CROSS-REFERENCE TO RELATED APPLICATIONS

This application claims the benefit of Korean Patent Application No. 10-2013-0072708 filed on Jun. 24, 2013, the subject matter of which is hereby incorporated by reference.

BACKGROUND

The inventive concept relates to memory devices, memory systems, and methods of reading data that provides improved read data reliability and data read speed.

As the quantities of data processed by contemporary memory devices and memory systems continues to increase, the speed with which data may be reliability "read" (i.e., retrieved from a stored location) has become an increasingly important performance parameter.

SUMMARY

The inventive concept provides memory devices, memory systems, and methods of reading data characterized by improved operating reliability and speed.

In one embodiment, the inventive concept provides a method of reading data in a memory system including a non-volatile memory device, the method comprising; reading first data stored in a first block of the non-volatile memory device using a first read scheme in response to a first read command, wherein the first read scheme is capable of detecting/correcting an error in the first data, upon determining an uncorrected error in the first data, setting the first block as a first temporary bad block, and reading second data stored in the first temporary bad block using a second read scheme different from the first read scheme in response to a second read command, wherein the second read scheme is capable of detecting/correcting an error in the second data, upon determining an uncorrected error in the second data, setting the first temporary bad block as a bad block.

In another embodiment, the inventive concept provides a method of operating a memory system including a non-volatile memory device divided into memory blocks, the method comprising; using different read schemes to assign each memory block one of a range of read/write block designation levels, and thereafter, programming write data to each memory block in accordance with an assigned one of the read/write designation levels.

In another embodiment, the inventive concept provides a memory system comprising; a non-volatile memory cell array including memory blocks that store data, and a memory controller configured to control operation of the non-volatile memory cell array. The memory controller is configured to read first data stored in a first block of the non-volatile memory device using a first read scheme the first read scheme being capable of detecting/correcting an error in the first data, and upon determining an uncorrected error in the first data, setting the first block as a first temporary bad block, and is further configured to read second data stored in the first temporary bad block using a second read scheme different from the first read scheme, the second read scheme being capable of detecting/correcting an error in the second data.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Hereinafter, embodiments of the inventive concept will be described with reference to the accompanying drawings. The inventive concept may, however, be embodied in many different forms and should not be construed as being limited to the illustrated embodiments. Rather, these embodiments are provided so that this disclosure will be thorough and complete, and will fully convey the inventive concept to those of ordinary skill in the art. Throughout the written description and drawings, like reference numbers and label are used to denote like or similar elements.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
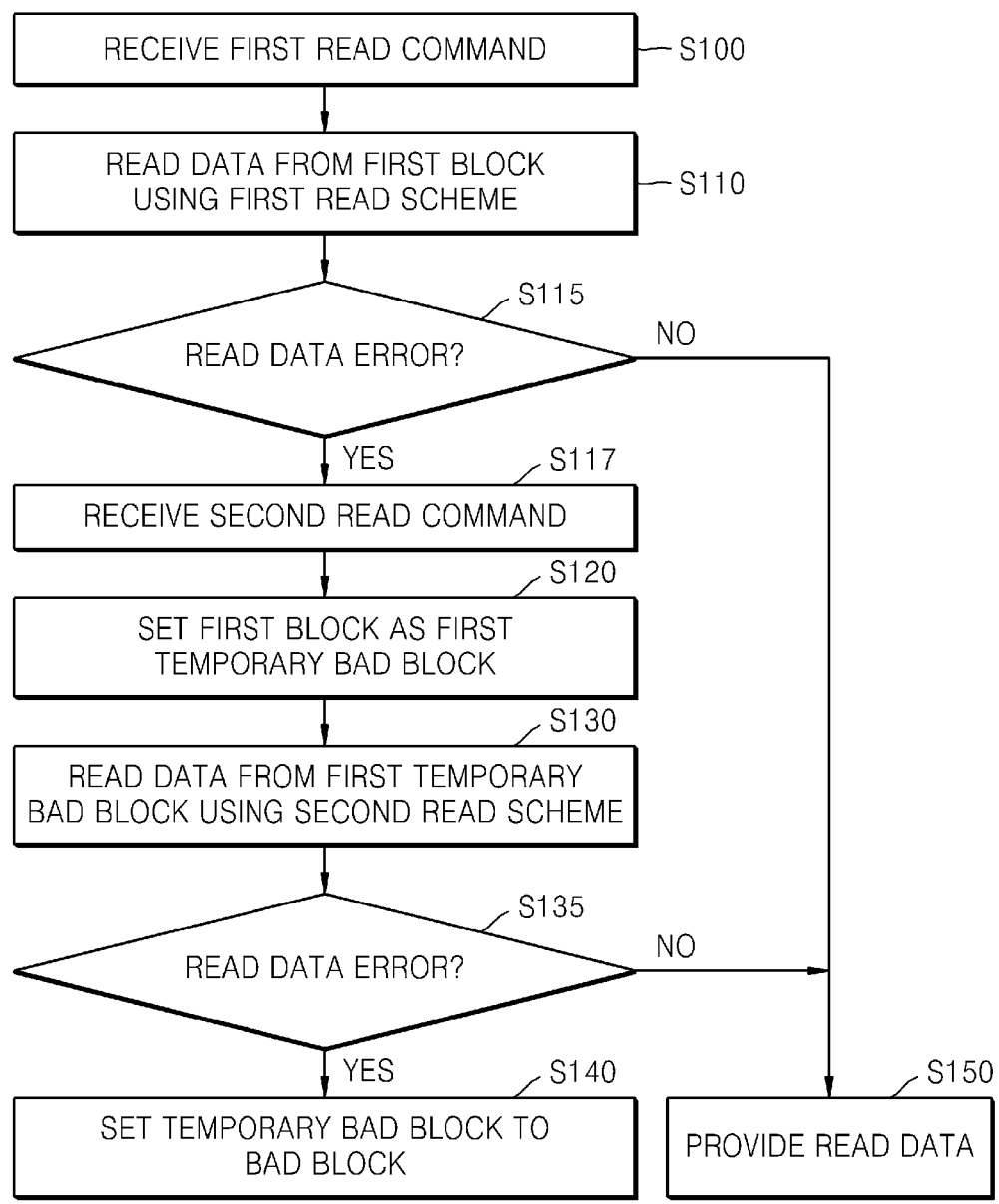
FIG. 1 is a flowchart illustrating a method of reading data in a memory system according to an embodiment of the inventive concept.

FIG. 1 is a flowchart illustrating a method of reading data in a memory system according to an embodiment of the inventive concept.

Referring to FIG. 1, the illustrated method of reading data begins when a first read command is received (S100). The read command identifies "read data" stored in a first block of a non-volatile memory device and causes the execution of a read operation directed to the read data that uses a first read scheme (S110). As part of the first reading attempt, the first read scheme includes one or more processes that seek to detect and/or correct (hereafter, "detect/correct") any data error(s) included in the read data. If at least one error in the read data cannot be corrected using the first read scheme (S115=Y), then a second read command is received (S117) and the first block is "set" (i.e., logically designated) as a "first temporary bad block" (S120). In this regard, the first block may be set to the first temporary bad block before or after the second read command is received.

Thus, if the first attempt at reading the read data results in errant data, then a second attempt is made to read the read data stored in the first temporary bad block using a second read scheme different from the first read scheme. (S130). Thus, the second read attempt is made in response to a second read command that may (but need not be) be different from the first read command. Here again, as part of the second reading attempt, the second read scheme includes one or more processes that seek to detect/correct any data error(s) included in the read data. If at least one error in the read data cannot be corrected using the second read scheme (S135=Y), then the first temporary bad block is set (re-set, or further logically designated) as a "bad block" (S140).

In contrast, if the first read scheme (S115=N) or the second read scheme (S135=N) is successful in reading the read data stored in the first block or the first block designated as a first temporary bad block, then the read data may be provided to a circuit external to the non-volatile memory device as output data (S150).

Figure 2:
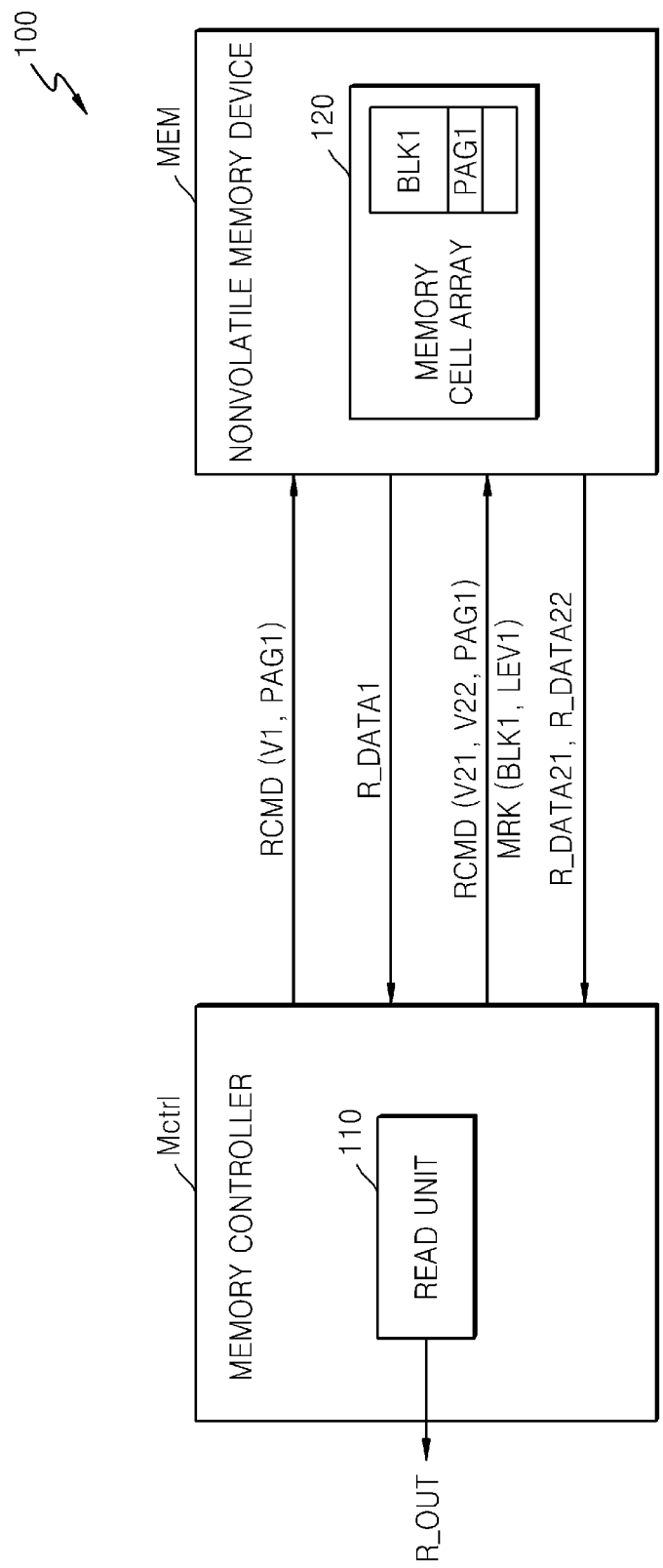
FIG. 2 is a block diagram illustrating a non-volatile memory system according to an embodiment of the inventive concept.

FIG. 2 is a block diagram illustrating in one example a non-volatile memory system 100 according to an embodiment of the inventive concept. The method summarized by FIG. 1 will be further described in the context of the non-volatile memory system 100.

Thus, referring to FIGS. 1 and 2, it is assumed that the non-volatile memory system 100 of FIG. 2 comprises a non-volatile memory device (MEM) capable of storing data, and a memory controller (Mctrl) that controls at least program, read, and erase operations executed by the non-volatile memory device.

In certain embodiments of the inventive concept, the non-volatile memory device of FIG. 2 may be a NAND flash memory, and will include one or more memory cell arrays 120. The memory cell array 120 includes one or more memory blocks (e.g., BLK1) including one or more pages (e.g., PAG1). In certain embodiments of the inventive concept, each memory block may erased during an erase operation on a block unit basis, while being programmed during a program operation or read during a read operation on a page unit basis.

The non-volatile memory device of FIG. 2 may further include control logic, input/output (I/O) circuitry, and power voltage generation circuitry that is conventionally well understood, and that is therefore not described in any detailed herein.

The memory controller of FIG. 2 is assumed to include a read unit 110 capable of generating the read command (RCMD). Thus, in the context of the reading method of FIG. 1, the read command may be directed to read data stored in the first block (BLK1) of the memory cell array 120 and may be communicated from the memory controller to the non-volatile memory device of FIG. 2, resulting in the execution of the read operation summarized in FIG. 1.

For example, the read unit 110 may be used to generate the first read command [e.g., RCMD(V1, PAG1)] identifying the read data stored in a first page PAG1 of the first block BLK1 of the memory cell array 120. The first read command may further identify a hard read voltage (V1) that is used to make a "hard decision" according to the first read scheme (S110). That is, the memory controller will receive read data (R_DATA1) in response to the first read command, and then the memory controller will determine whether at least one data error is present in the read data in accordance with the hard-decision results provided as a result of executing the read operation using the first read scheme (S110).

However, when one or more uncorrected error(s) is detected in the read data (S115=Y), the read unit 110 of the memory controller may be used to generate a control command [e.g., MRK(BLK1, LEV1)] that sets the first block as a first temporary bad block (Bad Block_lev1) (S120). Further, when one or more uncorrected error(s) is detected in the read data (S115=Y), the read unit 110 of the memory controller may be used to generate a second read command (S117) [e.g., RCMD(V21, V22, PAG1)] again identifying read data stored at the first page PAG1 of the first block, but now also identifying one or more soft read voltages V21 and V22 that may be used to read to make a "soft decision" according to the second read scheme.

As a result, the memory controller will receive read data (e.g., R_DATA21, R_DATA22) in response to the second read command. If the execution of either the first or second read schemes results in acceptable read data (i.e., read data having none, or having an acceptable number of errors), then the read data may be provided as output read data (R_OUT) by the memory controller Mctrl.

In certain embodiments of the inventive concept, the memory controller Mctrl may perform error check (detect) and correction by using low density parity check (LDPC) routine. This possible approach will be described in some additional detail with reference to FIG. 3, hereafter.

Therefore, according to the following, when one or more uncorrected error(s) are present in read data (R_DATA1) obtained from the first block (BLK1) using the first read scheme (hereafter, "first read data") in response to a first read (or hard decision) command, the non-volatile memory system 100 of FIG. 2 may generate the control command [e.g., MRK(BLK1, LEV1)] that sets the first block BLK1 as the first temporary bad block (e.g., Bad Block_lev1), and thereafter effectively improve the operating speed of the memory device or memory system using the designation of the first temporary bad block which may thereafter be read in a different manner than blocks of the memory cell array 120 not so designated.

In effect, certain embodiments of the inventive concept may include a non-volatile memory system that performs a type of bad block levelling according to whether identified read data has been successfully read using the first read scheme or the second read scheme. In this context the term successful will be interrupted according to the error detect/correct capabilities of a particular read scheme. For example, when read data stored in the first block is not error-corrected while being read according the first read scheme, but is error-corrected while being read according to the second read scheme, the first block will be set as the first temporary bad block. However, when read data included in the first block is not error-corrected while being read according to the first and second read schemes, the first block will set as a bad block.

In view of these different designations, subsequently received read commands directed to a read data stored in a good block, verses a first temporary bad block, verses a bad block may be differently managed and processed, thereby making it possible to improve the overall operating speed of the memory device and/or constituent memory system.

Those skilled in the art will recognize that the use of two (2) read schemes is merely an example. Any reasonable number of data reading schemes having different error detect/correct capabilities may be similarly used in various embodiments of the inventive concept. As a result, memory blocks in a memory cell array may have one of a number of different "read/write block designation levels" ranging from a good block storing fully acceptable data, through a number (N) of different read impairment levels (e.g., first temporary, second temporary . . . Nth temporary) each storing read data of particular quality, down to bad blocks storing read data deemed un-correctable or fully unacceptable.

Further, the read block designations levels may be used during subsequent program operations to properly assigned write data being written to the memory cell array according to block quality. For example, incoming write data may not be written to (but may be read from) a block designated as a first temporary bad block, while incoming write data may be written to a block designated a second temporary bad block. Alternately, when incoming write data must be written to a memory device having 90% of its data storage capacity full, then write data may be written to designated first temporary bad block(s), wherein only when the memory device has 95% of its data storage capacity full may incoming write data be written to blocks designated as second temporary bad block(s). Consistent with the foregoing, write data is never written to, or read from a designated bad block.

Figure 3:
FIG. 3 is a diagram illustrating an example of a method for a memory controller of FIG. 2 to generate final read data.

FIG. 3 is a conceptual diagram further illustrating the working example described in the context of FIGS. 1 and 2 wherein a method of reading data is performed by the memory controller Mctrl of FIG. 2 to generate output read data (R_OUT).

Referring to FIG. 3, it is assumed that the original (e.g., 7-bit) read data (Data_org[0~6]) stored in the first page (PAG1) is 1101010. As the original data is stored in the first page, corresponding parity data is generated and stored in high-reliability memory cell of the memory cell array. In one example, parity data may be the arithmetic sum of the bit string of the original data or 100 (Parity[0~2]) in the illustrated embodiment.

Next, it is assumed that first read data (R_DATA1) is retrieved from the first page PAG1 using the first read scheme and the hard read voltage V1. However, it is further assumed that the first read data is obtained as 1101000 (R_Data1[0~6]). Upon receiving the first read data, the memory controller of FIG. 2 will calculate an arithmetic sum of the errant bit string of R_Data1[0~6] to obtain 011. This value is recognized as being different from the stored parity data "100". Hence, the memory controller will determine that at least one error is present in the first read data (R_DATA1).

Because there is an error in the first read data (R_DATA1), the read unit 110 of the memory controller may be used to generate the second read command [e.g., RCMD(V21, V22, PAG1)] directed to the first page (PAG1) and indicating the use of soft read voltages V21 and V22. It is now assumed that second/first read data (R_DATA21) obtained using the first soft read voltage V21 is 1101000(R_Data21[0~6]) and second/second read data (R_DATA22) obtained using the second soft read voltage V22 is 1101010(R_Data22[0~6]). In the memory controller of FIG. 2, these second read scheme results allow the fifth bit of the second read data sets (R_DATA21[5] and R_DATA22[5]) to be identified as the errant read data bit. This bit may now be corrected.

One possible soft decision scheme that may be used in certain embodiments of the inventive concept will be described in some additional detail with reference to FIG. 9, hereafter.

Figure 4:
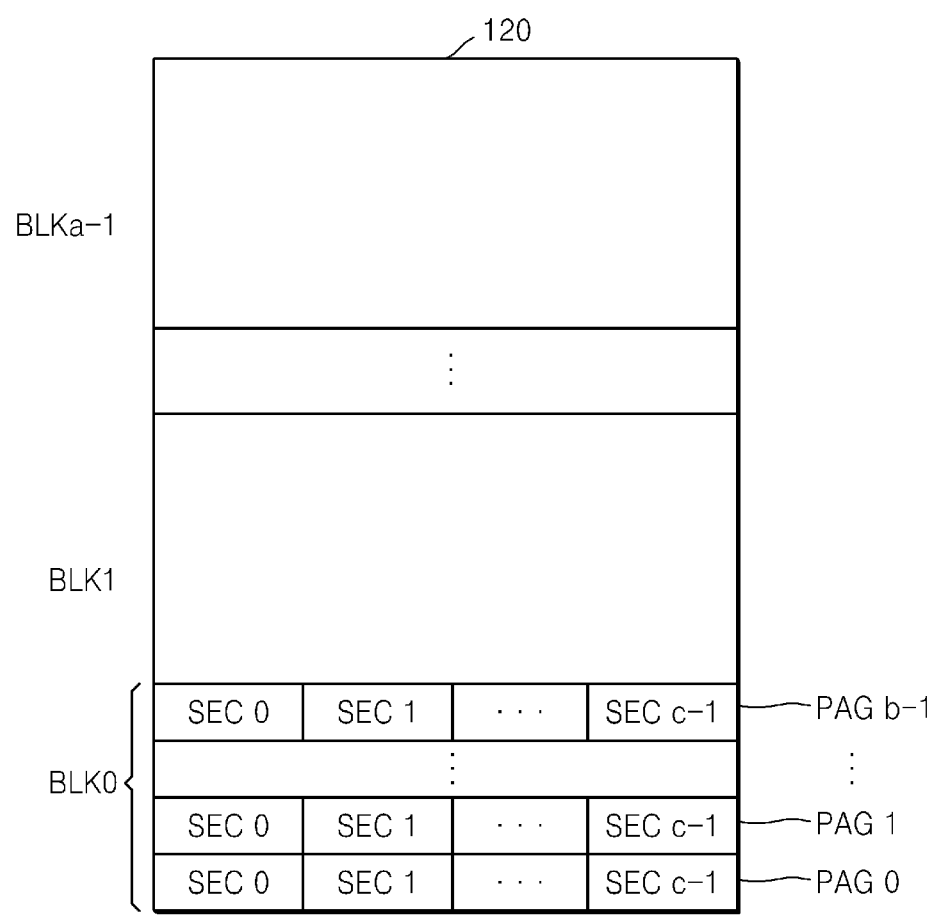
FIG. 4 is a diagram illustrating an example of a structure of a memory cell array included in a flash memory according to an embodiment of the inventive concept.

FIG. 4 is a conceptual diagram illustrating one possible structure for the memory cell array 120 included in a flash memory according to an embodiment of the inventive concept.

Referring to FIGS. 2 and 4, the non-volatile memory device MEM of the non-volatile memory system 100 includes the memory cell array 120. The memory cell array 120 may include two or more blocks BLK0 to BLKa-1, each including two or more pages (e.g., PAG0 to PAGb-1), wherein each of the pages PAG0 to PAGb-1 includes two or more sectors (e.g., SEC0 to SECc-1). For the convenience of illustration, FIG. 4 illustrates only the pages PAG0 to PAGb-1 and the sectors SEC0 to SECc-1 of the block BLK0; however, the other blocks BLK1 to BLKa-1 may also have the same structure as the block BLK0.

Figure 5:
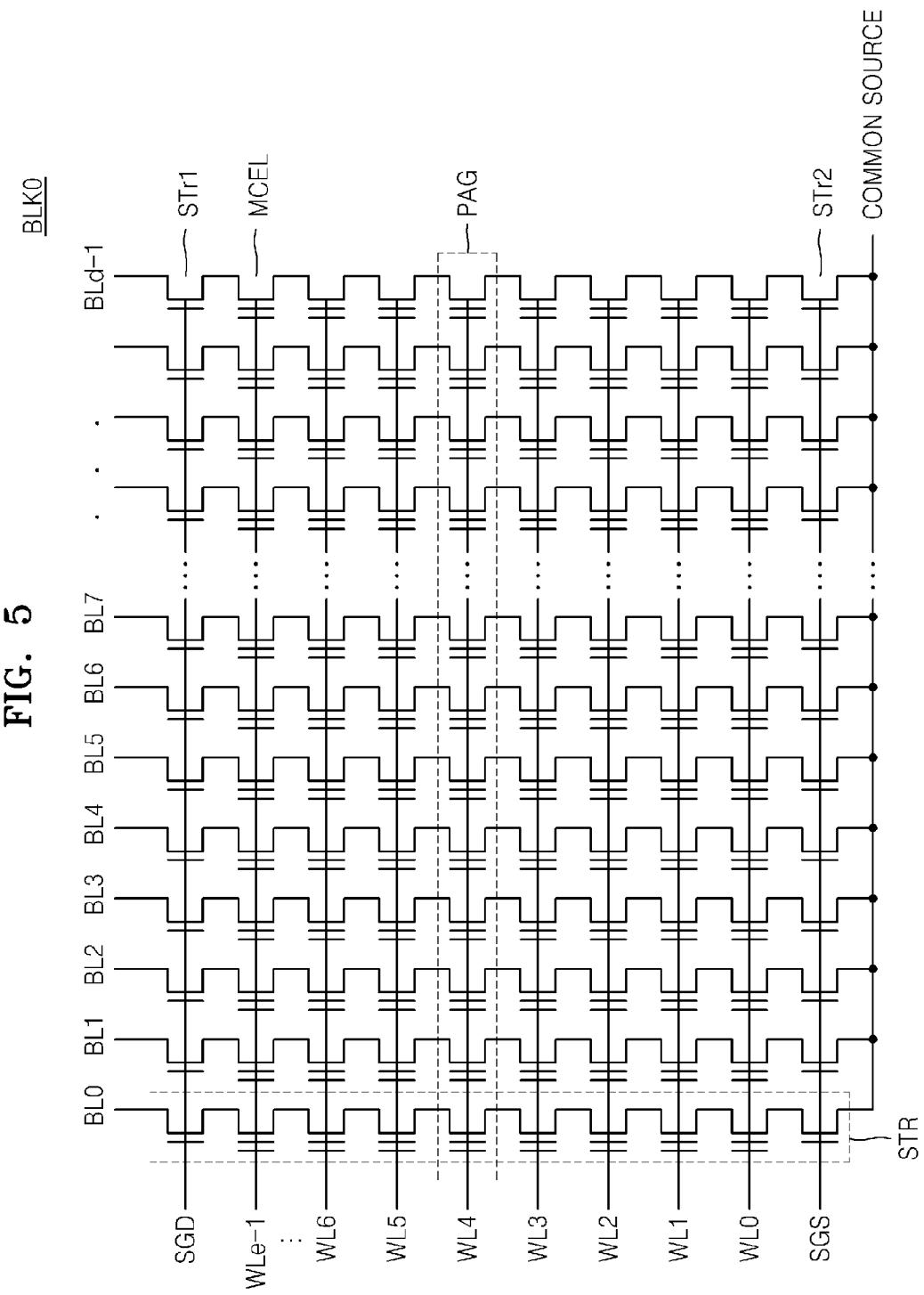
FIG. 5 is a diagram illustrating an example of a block of FIG. 4.

FIG. 5 is a partial circuit diagram illustrating in one example block BLK0 of FIG. 4.

Referring to FIGS. 4 and 5, when the memory cell array 120 of FIG. 4 is assumed to be a NAND flash memory, wherein each of the blocks BLK0 to BLKa-1 includes two or more strings STR of memory cells MCEL are connected in series in the direction of bit lines BL0 to BLd-1. Each string STR may include a drain select transistor STr1 and a source select transistor STr2 that are connected to both ends of the memory cells MCEL connected in series.

According to an embodiment of the inventive concept, the non-volatile memory device MEM may perform an erase operation in units of blocks, and perform a program operation in units of pages corresponding to word lines WL0 to WLe-1. The non-volatile memory device MEM may include a plurality of memory cell arrays that have the same structure and perform the same operation as the above-described memory cell array 120.

Figure 6:
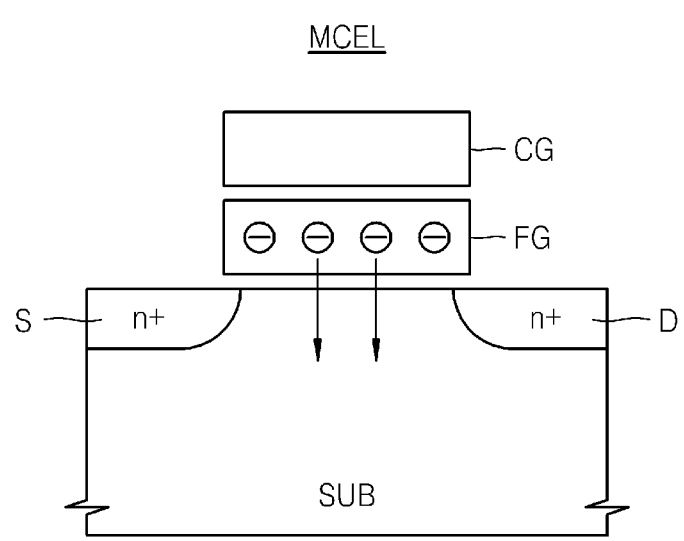
FIG. 6 is a cross-sectional view illustrating an example of a memory cell of FIG. 5.

FIG. 6 is a cross-sectional view illustrating the operation of each memory cell in FIG. 5.

Figure 11:
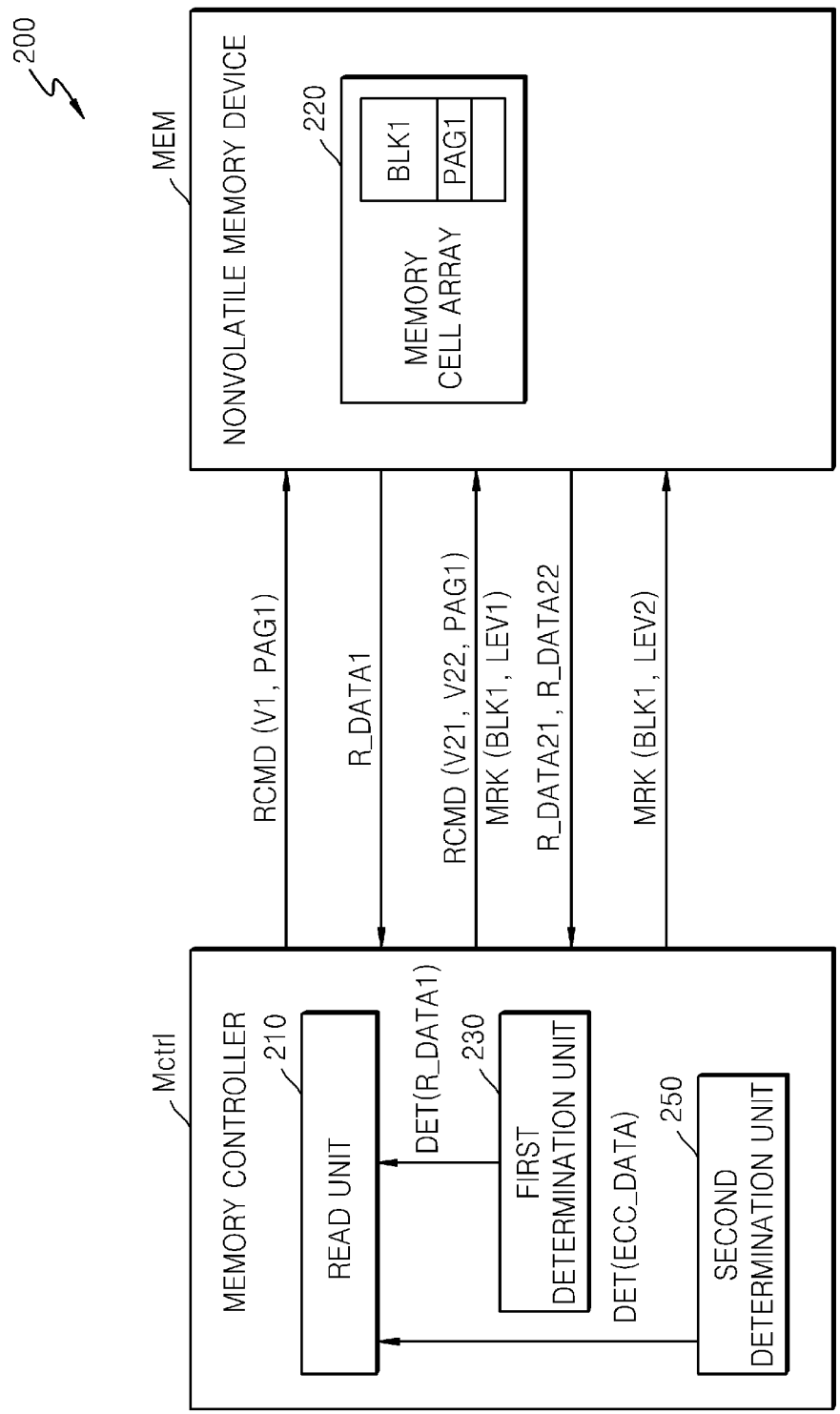
FIG. 11 is a block diagram illustrating a non-volatile memory system according to another embodiment of the inventive concept.

Each memory cell MCEL of the memory cell arrays included in the embodiments of FIG. 5 and FIG. 11, for example, includes a source (S) and drain (D) formed in a substrate (SUB). A channel region is formed between the source S and the drain D, and a floating gate (FG) is formed over the channel region and separated from the channel by a tunnelling insulating layer. A control gate (CG) is formed on the floating gate FG, and an insulating layer such as a blocking insulating layer may be disposed between the floating gate FG and the control gate CG. Voltages necessary for program, erase and read operations on the memory cell MCEL may be applied to the substrate SUB, the source S, the drain D, and the control gate CG.

In the flash memory of FIG. 5, data stored in the memory cell MCEL may be read by identification of a threshold voltage Vth of the memory cell MCEL. The threshold voltage Vth of the memory cell MCEL may be determined according to the amount of electrons stored in the floating gate FG. For example, as the amount of electrons stored in the floating gate FG increases, the threshold voltage of the memory MCEL may increase.

One bit, two bits or three or more bits of data may be set in a predetermined range of the threshold voltage Vth of the memory cell MCEL. Accordingly, one page or two or more pages may be set in each word line of FIG. 5. That is, one page of two or more pages may be programmed in each word line.

FIG. 7 is a conceptual diagram illustrating a threshold voltage distributions that depend on respective program states for the memory cells of the memory cell array 120 of FIG. 4.

Figure 7A:
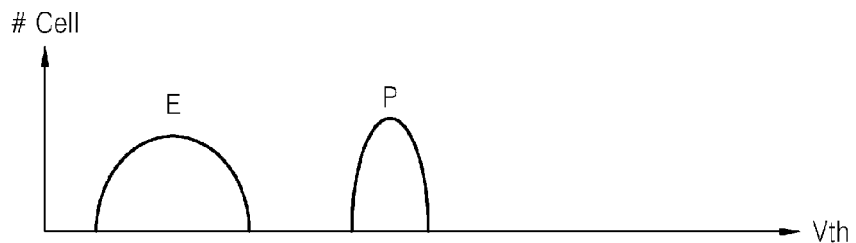
FIGS. 7A, 7B and 7C are diagrams each illustrating a threshold voltage distribution depending on a program state set for the memory cell array of FIG. 4.

Referring to FIG. 7, the non-volatile memory system 100 according to an embodiment of the inventive concept may include a non-volatile memory device MEM in which one-bit data is set in each threshold voltage range, that is, each threshold voltage distribution, as illustrated in FIG. 7A. A NAND flash memory having this structure is referred to as a single-level cell (SLC) NAND flash memory. One-bit data may be programmed in each memory cell MCEL of the SLC NAND flash memory. In the SLC NAND flash memory, one page may be set at each word line of FIG. 5.

Figure 7B:
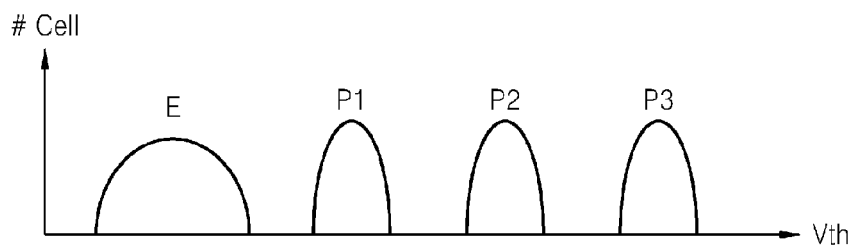
Figure 7C:
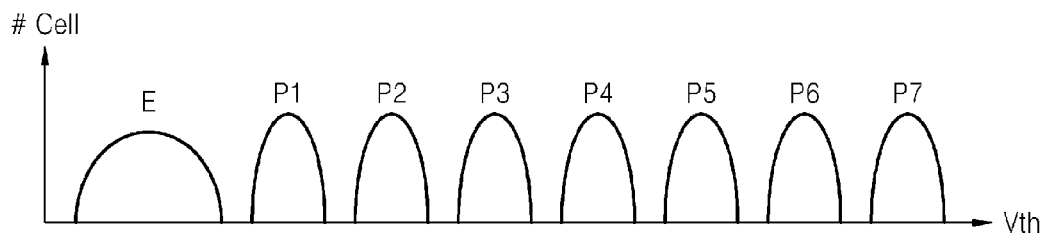

Also, the non-volatile memory system 100 according to an embodiment of the inventive concept may include a non-volatile memory device MEM in which two or more bits of data is set in each threshold voltage range, that is, each threshold voltage distribution, as illustrated in FIG. 7B or 7C. A NAND flash memory having this structure is referred to as a multi-level cell (MLC) NAND flash memory. Two or more bits of data may be programmed in each memory cell MCEL of the MLC NAND flash memory. In the MLC NAND flash memory, two or more pages may be set at each word line of FIG. 5.

A NAND flash memory in which 3-bit data is programmed in a memory cell may be referred to as a triple-level cell (TLC) NAND flash memory. However, for the convenience of description, hereinafter, NAND flash memories in which two or more bits of data is programmed in a memory cell will be collectively referred to as an MLC NAND flash memory. In the MLC NAND flash memory, a hard read voltage may be set as three or more voltage levels in order to identify four or more threshold voltage distributions.

The non-volatile memory system 100 according to an embodiment of the inventive concept may include an SLC NAND flash memory or an MLC non-volatile memory device MEM, as described above. However, embodiments of the inventive concept are not limited thereto. The non-volatile memory system 100 according to an embodiment of the inventive concept may include both an SLC NAND flash memory and an MLC NAND flash memory. Also, the non-volatile memory device MEM according to an embodiment of the inventive may program data in some of the blocks BLK0 to BLKa-1 of FIG. 8 by an SLC scheme, and program data in the other blocks by an MLC scheme.

In the above-described flash memory according to an embodiment of the inventive concept, various performance degradation may occur due to its inherent structural limitation and peripheral environments. For example, as for the flash memory according to an embodiment of the inventive concept, a threshold voltage distribution set as illustrated in FIG. 7 may change as illustrated in FIG. 8, due to common source line noise, memory cell endurance fatigue caused by excessive program/erase operations, unintended retention of electrons by the floating gate FG, a read disturbance, and/or temperature changes.

Figure 8A:
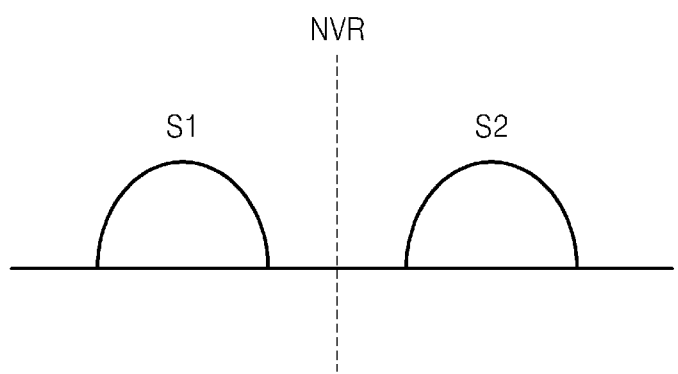
FIGS. 8A and 8B are diagrams each illustrating a threshold voltage distribution change of the memory cell array.
Figure 8B:
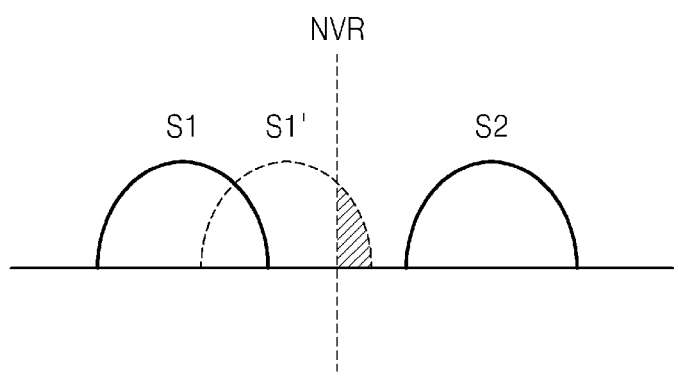

Referring to FIG. 8, while two threshold voltage distributions S1 and S2 are identified by the hard decision voltage of FIG. 2 set to the voltage level between the threshold voltage distributions S1 and S2 as illustrated in FIG. 8A, the threshold voltage distribution may change due to the performance degradation of the non-volatile memory device MEM as illustrated in FIG. 8B. FIG. 8B illustrates an example in which the first threshold voltage distribution S1 shifts toward the second threshold voltage distribution S2. In the example of FIG. 8B, when a read operation is performed by a hard decision voltage, a hatched region may have an error that data different from programmed data is read.

This error may be detected and/or corrected by an error check and correction (ECC) engine. For example, the ECC engine may generate parity data by encoding data to be written, and may detect and correct an error by decoding read data and parity data included therein.

Figure 9:
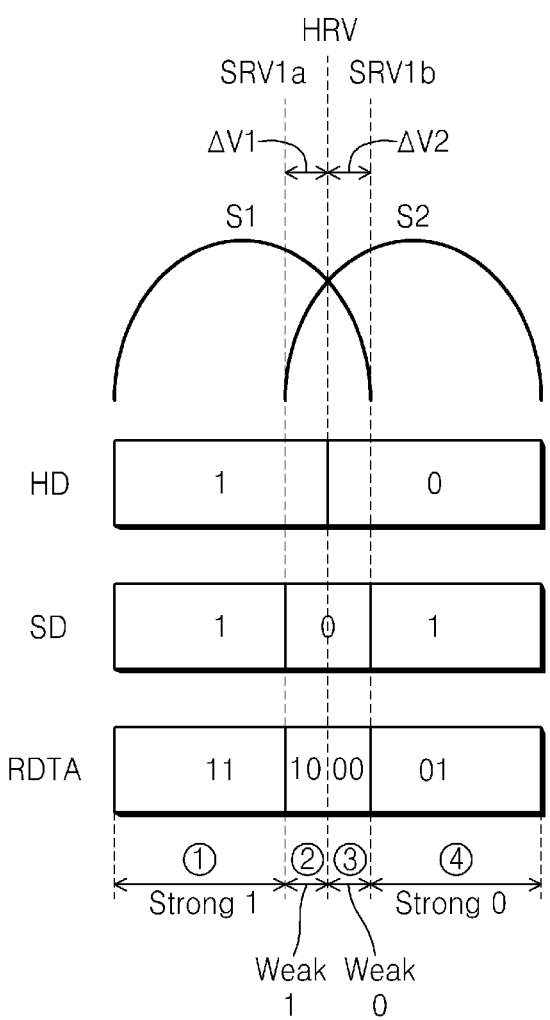
FIG. 9 is a diagram illustrating a soft decision operation that may be performed for error correction.

FIG. 9 is a diagram illustrating a soft decision operation that may be performed to detect and correct errors in certain data reading methods according to various embodiments of the inventive concept.

Referring to FIGS. 2 and 9, the soft decision operation applies a hard read voltage HRV to the first page PGA1 of the memory cell array and determines which of the first threshold voltage distribution S1 and the second threshold voltage S2 the threshold voltage of each memory cell is included in. The memory cell having a threshold voltage lower than the hard read voltage HRV may be identified as "1", and the memory cell having a threshold voltage higher than the hard read voltage HRV may be identified as "0".

The hard read voltage HRV may have the same voltage level as the hard decision voltage that is used to identify the first threshold voltage distribution S1 and the second threshold voltage distribution S2. As described above, in the MLC flash memory having four or more threshold voltage distributions, the hard decision voltage may have a plurality of voltage levels. In this case, the hard read voltage HRV may have a voltage level for identification of the first threshold voltage distribution S1 and the second threshold voltage distribution S2, among the plurality of voltage levels. Data identified by the hard read voltage HRV may be referred to as hard data HD.

Next, the soft decision operation may sense soft data SD by sequentially applying a first soft read voltage SRV1$a$ and a second soft read voltage SRV1$b$, which are paired and respectively have differences of a first voltage value $\Delta V1$ and a second voltage value $\Delta V2$ from the hard read voltage HRV, to the first page PGA1. The memory cell having a threshold voltage lower than the first soft read voltage SRV1*a* may be identified as "1", and the memory cell having a threshold voltage higher than the first soft read voltage SRV1*a* and lower than the second soft read voltage SRV1*b* may be identified as "0". The memory cell having a threshold voltage higher than the second soft read voltage SRV1*b* may be identified as "1". Soft data SDTA may be generated by exclusively-ORing a bit value due to the on-off of the memory cell according to the first soft read voltage SRV1*a* and an inverse value of a bit value due to the on-off of the memory cell according to the second soft read voltage SRV1*b*.

In the example of FIG. 9, reliability data RDTA based on the hard data HDTA and the soft data SDTA may have values of 11, 10, 00 and 01 in periods ①, ②, ③ and ④ respectively. However, embodiments of the inventive concept are not limited thereto, and the reliability data RDTA based on the hard data HDTA and the soft data SDTA may be set as different values.

The non-volatile memory system 100 may set data (bit), which is read from the memory cell having a threshold voltage included in the period ① in which the reliability data RDTA is identified as "11", as strong 1 (which represents that there is a high probability that a relevant data (bit) value will be identified as "1" and will be "1"). That is, the non-volatile memory system 100 may allocate a weight of strong 1 to the data (bit) that is read from the memory cell having a threshold voltage included in the period ① in which the reliability data RDTA is identified as "11". The non-volatile memory system 100 may set data (bit), which is read from the memory cell having a threshold voltage included in the period ② in which the reliability data RDTA is identified as "10", as weak 1 (which represents that there is a low probability that a relevant data (bit) value will be identified as "1" and will be "1"). That is, the non-volatile memory system 100 may allocate a weight of weak 1 to the data (bit) that is read from the memory cell having a threshold voltage included in the period ② in which the reliability data RDTA is identified as "10".

Likewise, the non-volatile memory system 100 may allocate a weight of strong 0 (which represents that there is a high probability that a relevant data (bit) value will be identified as "0" and will be "0") to data (bit) that is read from the memory cell having a threshold voltage included in the period ③ in which the reliability data RDTA is identified as "00", and may allocate a weight of weak 0 (which represents that there is a low probability that a relevant data (bit) value will be identified as "0" and will be "0") to data (bit) that is read from the memory cell having a threshold voltage included in the period ④ in which the reliability data RDTA is identified as "01". The weight obtained by the soft decision operation may be used as an error correction reference.

Figure 10:
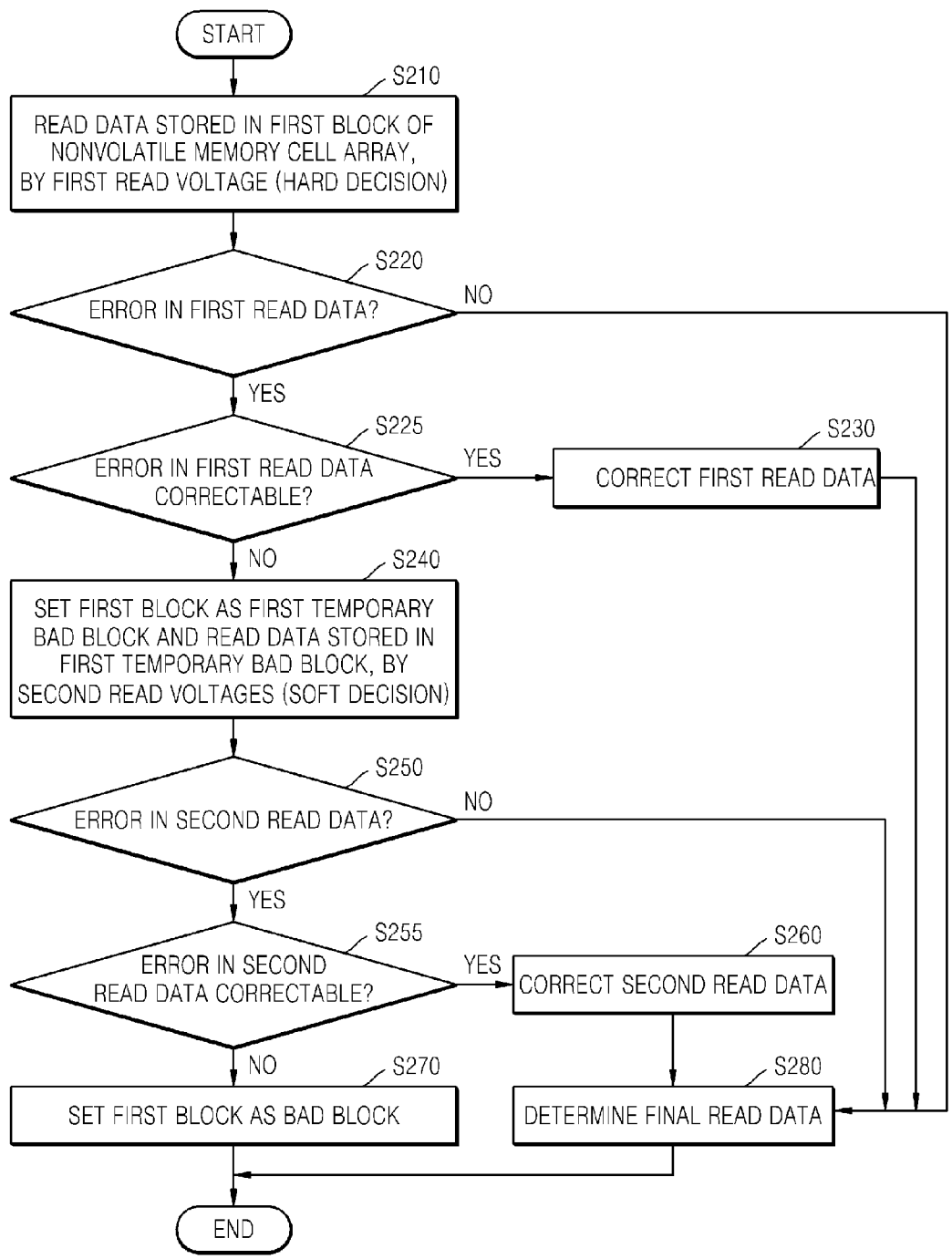
FIG. 10 is a flowchart illustrating a method of reading data in a memory system according to another embodiment of the inventive concept.

FIG. 10 is a flowchart illustrating a method of reading data in a memory system according to another embodiment of the inventive concept.

Referring to FIG. 10, a read method according to an embodiment of the inventive concept comprises: performing a first read operation (S210) of reading data stored a first block of a non-volatile memory cell array using a first read voltage; determining whether an error has occurred in the first read operation (S220); determining whether the error that has occurred in the first read operation is correctable (S225); and if the first read data is correctable (S225=Y), correcting the first read data (S230).

However, if the first read data is not correctable (S225=N), then the first block is set (or designated) as a first temporary bad block, and the read data stored in the first temporary bad block is then read using one or more soft read voltages (S240). Next, a determination is made as to whether an error has occurred in the second read data (S250) and whether the error in the second read data is correctable (S255). If the error in the second read data is correctable (S255=Y), the second read data is corrected (S260), else if the error in the second read data is not correctable (S255=N) the first block is set as a bad block (S270).

In this manner, acceptable first read data (S220=N), corrected first read data (S230), acceptable second read data (S250=N), and corrected second read data may be determined to be final read data (S280).

Therefore, the read method in the memory system according to an embodiment of the inventive concept may set the first block as the first temporary bad block in discrimination from a general bad block when the error that has occurred in the first read operation (e.g., hard decision) is not corrected, and use the first temporary bad block, thereby improving the operation of the memory device or the memory system.

For example, the read method in the memory system according to an embodiment of the inventive concept may set the first temporary bad block and a general bad block discriminatively, and perform the second read operation without detecting and correcting an error in the first read operation when there is a read command about the first temporary bad block after the first temporary bad block is set, thereby improving the read speed thereof.

For example, the read method in the memory system according to an embodiment of the inventive concept may set the first temporary bad block and a general bad block discriminatively, and may not store data in the first temporary bad block when data is not stored in a predetermined region or more in the normal blocks in the non-volatile memory cell array, thereby improving the reliability of read data.

For example, when data is not stored in about 90% or more of the memory cells included in the normal block, data may not be written/read into/from the first temporary bad block. In another example, when data is not stored in about 95% or more of the memory cells included in the normal block, data may not be written/read into/from the first temporary bad block.

FIG. 11 is a block diagram illustrating a non-volatile memory system 200 according to another embodiment of the inventive concept.

Referring to FIGS. 10 and 11, the read method of FIG. 10 may be executed by the non-volatile memory system 200 of FIG. 11. The non-volatile memory system 200 of FIG. 11 may include a non-volatile memory device MEM that stores data, and a memory controller Mctrl that controls a program or read operation of the non-volatile memory device MEM. The non-volatile memory device MEM and the memory controller Mctrl of FIG. 11 may operate in the same manner as the non-volatile memory device MEM and the memory controller Mctrl of FIG. 2. A redundant description thereof will be omitted herein.

The memory controller Mctrl may include a read unit 210, a first determination unit 230, and a second determination unit 250. The read unit 210 generates a read command RCMD to read data from the memory cell array 220. One possible read operation will be described hereafter.

The read unit 210 may be used to generate a first read command [e.g., RCMD(V1, PAG1)] directed to read data is stored in the first page PAG1 of the first block BLK1. The resulting first read operation performed according to a first read scheme uses a hard read voltage V1 to make a hard decision. The first determination unit 230 may receive the resulting first read data (R_DATA1) corresponding to the first read command. Then, the first determination unit 230 may determine whether an error has occurred in the first read data and whether the error is correctable to generate a determination result [e.g., DET(R_DATA1)].

When there is an error in the first read data (R_DATA1) and the error is not correctable, the read unit 210 may be used to generate a control command [e.g., MRK(BLK1, LEV1)] to set the first block BLK1 as a first temporary bad block (Bad Block_lev1), and to generate a second read command [e.g., RCMD(V21, V22, PAW)] to re-read the first page PAG1 according to a second read scheme that uses a plurality of soft read voltages V21 and V22.

The second determination unit 250 may then receive the resulting second read data (e.g., R_DATA21, and R_DATA22) corresponding to the second read command in order to generate final read data (R_OUT).

Therefore, when an error in the first read data is not corrected in response to a hard decision command, the non-volatile memory system 200 may generate a control command to designate the first block BLK1 as the first temporary bad block, and thereby improve the operating speed of the memory device or the memory system by using the designation of the first temporary bad block.

For example, the non-volatile memory system 200 may set the first temporary bad block and a general bad block discriminatively, and perform the second read operation without detecting and correcting an error in the first read operation when there is a read command about the first temporary bad block after the first temporary bad block is set, thereby improving the read speed thereof.

Alternately and analogously to the description given above, the non-volatile memory system 200 may also set the first temporary bad block and a general bad block discriminatively, and may not store data in the first temporary bad block when data is not stored in a predetermined region or more in the normal blocks in the non-volatile memory cell array, thereby improving the reliability of read data.

Figure 12:
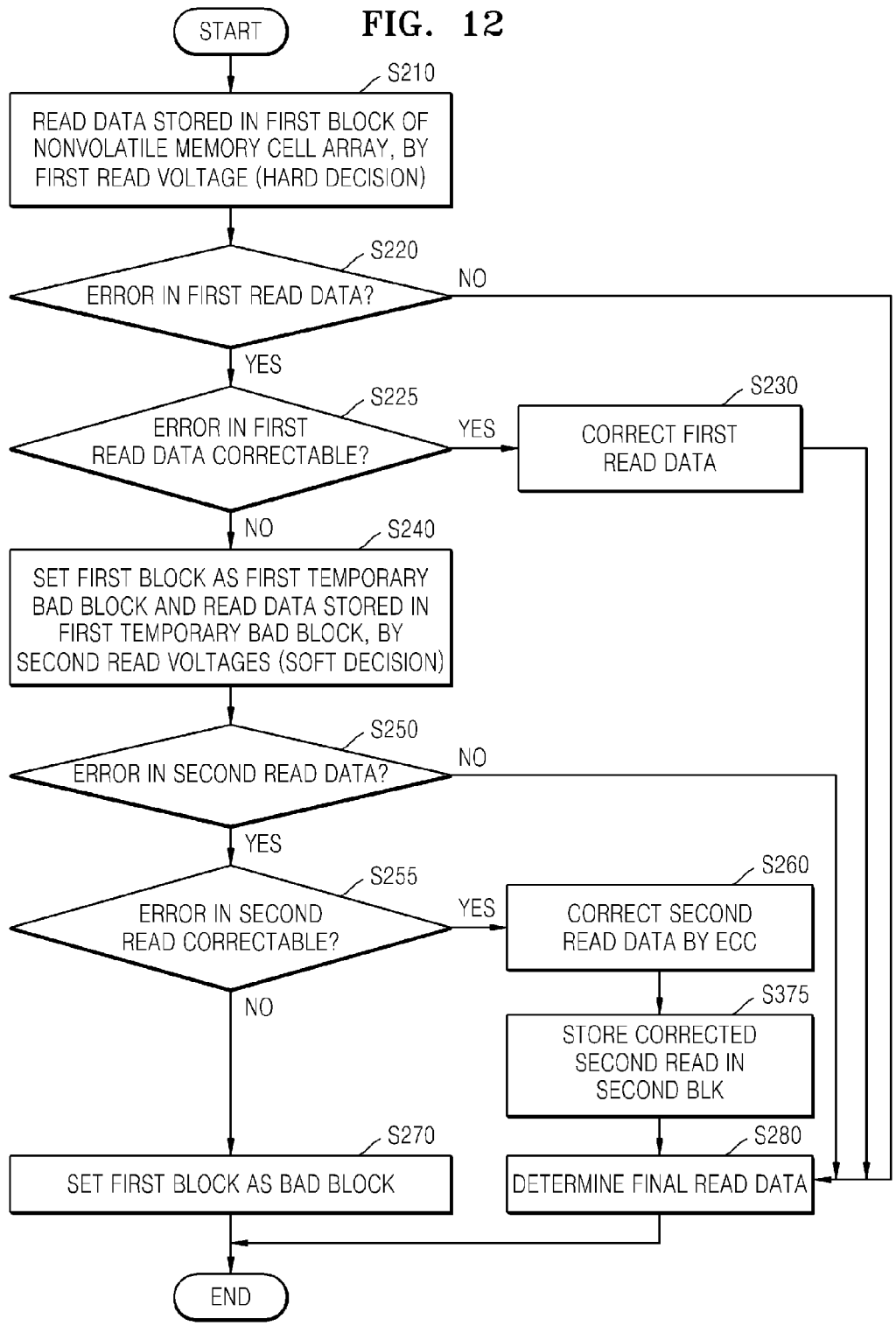
FIG. 12 is a flowchart illustrating a method of reading data in a memory system according to another embodiment of the inventive concept.

FIG. 12 is a flowchart illustrating a method of reading data in a memory system according to another embodiment of the inventive concept.

Referring to FIG. 12, the illustrated read method is the same as the method previously described with respect to the flowchart of FIG. 10, except for an additional step of storing the corrected second read data in a second block, where the second block is known to be a good (or normal) block (S375).

Figure 13:
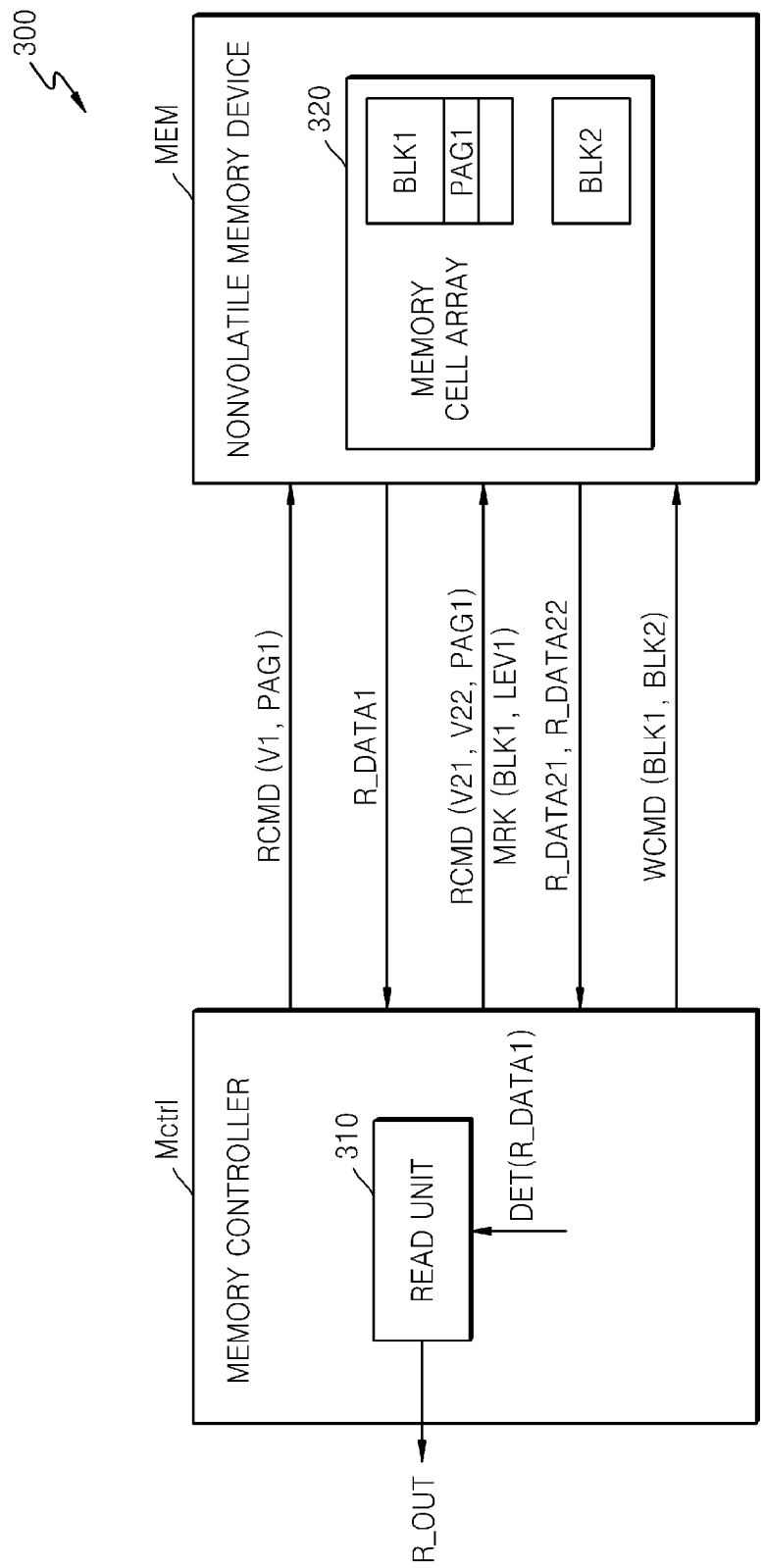
FIG. 13 is a block diagram illustrating a non-volatile memory system according to another embodiment of the inventive concept.

FIG. 13 is a block diagram illustrating a non-volatile memory system 300 according to another embodiment of the inventive concept.

Referring to FIGS. 12 and 13, the read method of FIG. 12 may be executed by the non-volatile memory system 300 of FIG. 13. The non-volatile memory system 300 of FIG. 13 may include a non-volatile memory device MEM and a memory controller Mctrl. The non-volatile memory device and the memory controller of FIG. 13 are assumed to operate in a similar manner to that of the non-volatile memory device and the memory controller of FIG. 2. Accordingly only different or additional feature are described hereafter.

The non-volatile memory device include one or more memory cell arrays 320, each including at least a first memory block (BLK1) and a second memory block (BLK2).

The read unit 310 of the memory controller will receive second read data (e.g., R_DATA21 and R_DATA22) in response to a second read command [e.g., RCMD(V21, V22, PAG0] and generates final read data (R_OUT). However, the memory controller thereafter stores the corrected second read data the second (known good) block BLK2 using a write command [e.g., WCMD (BLK1, BLK2)].

Figure 14:
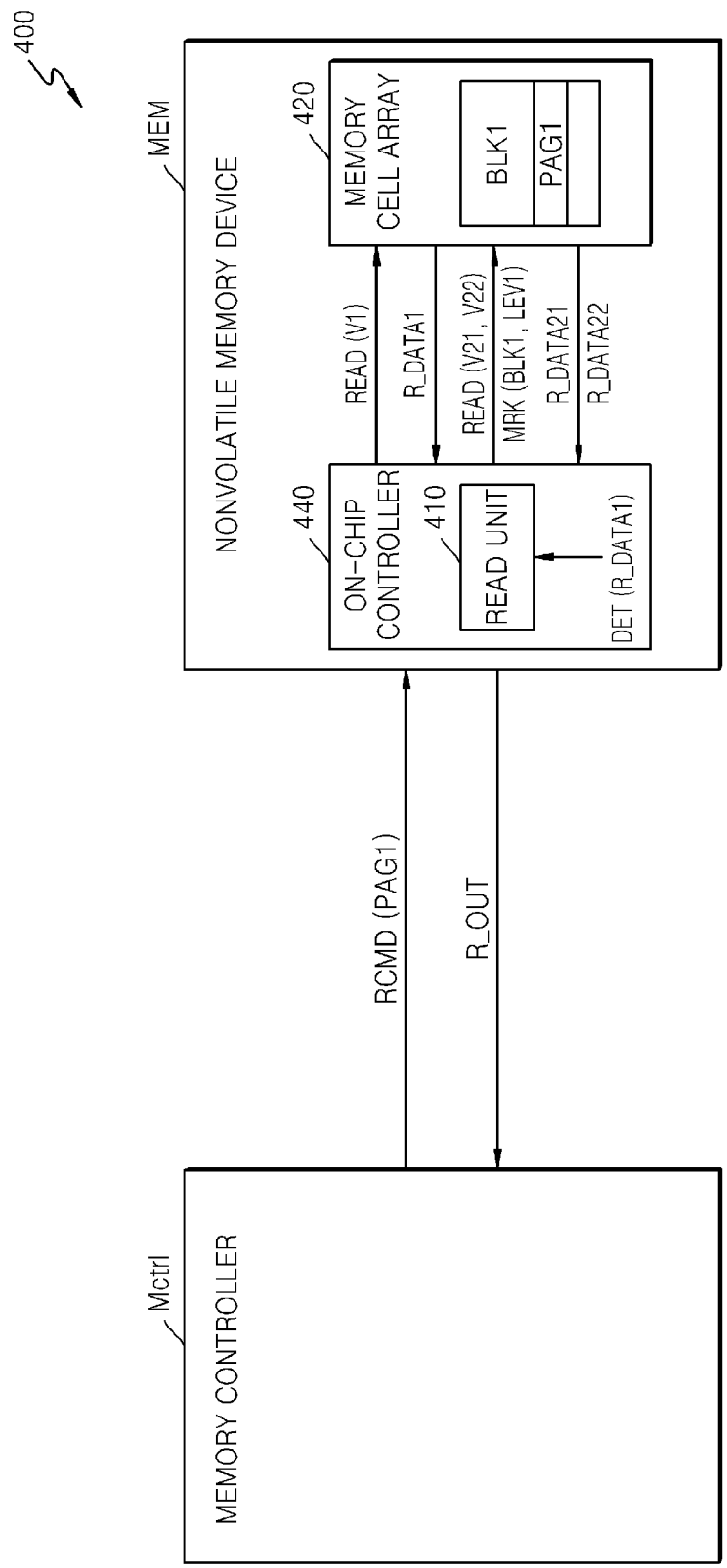
FIG. 14 is a block diagram illustrating a non-volatile memory system according to another embodiment of the inventive concept.

FIG. 14 is a block diagram illustrating a non-volatile memory system 400 according to another embodiment of the inventive concept.

The non-volatile memory system 400 of FIG. 14 includes a non-volatile memory device MEM that stores data, and a memory controller Mctrl that controls a program or read operation of the non-volatile memory device MEM.

Unlike the non-volatile memory device MEM of FIG. 2, the non-volatile memory device MEM of FIG. 14 includes an on-chip controller 440. The on-chip controller 440 may include a read unit 410. The read unit 410 may be used to receive a read command RCMD(PAG1) from the memory controller and reads data from the memory cell array 420.

That is, the read unit 410 may be used to generate a read command READ(V1) to read data stored in the first page PAG1 of the first block BLK1 using a hard read voltage V1 according to a hard decision scheme. The on-chip controller 440 may also be used to receive first read data (R_DATA1) corresponding to the first read command READ(V1), to determine whether an error has occurred in the hard decision, and to generate a determination result DET (R_DATA1).

When there is an error in the first read data (R_DATA1), the read unit 410 may be used to generate a control command (e.g., MRK(BLK1, LEV1)] to set the first block as a first temporary bad block, and to generate a second read command [e.g., READ(V21, V22)] to re-read the first page using a plurality of soft read voltages V21 and V22 according to a second read scheme.

The on-chip controller 440 then receives second read data (R_DATA21, R_DATA22) corresponding to the second read command and generates final read data (R_OUT). Therefore, the non-volatile memory system 400 may perform a read command by use of the on-chip controller 440.

Figure 15:
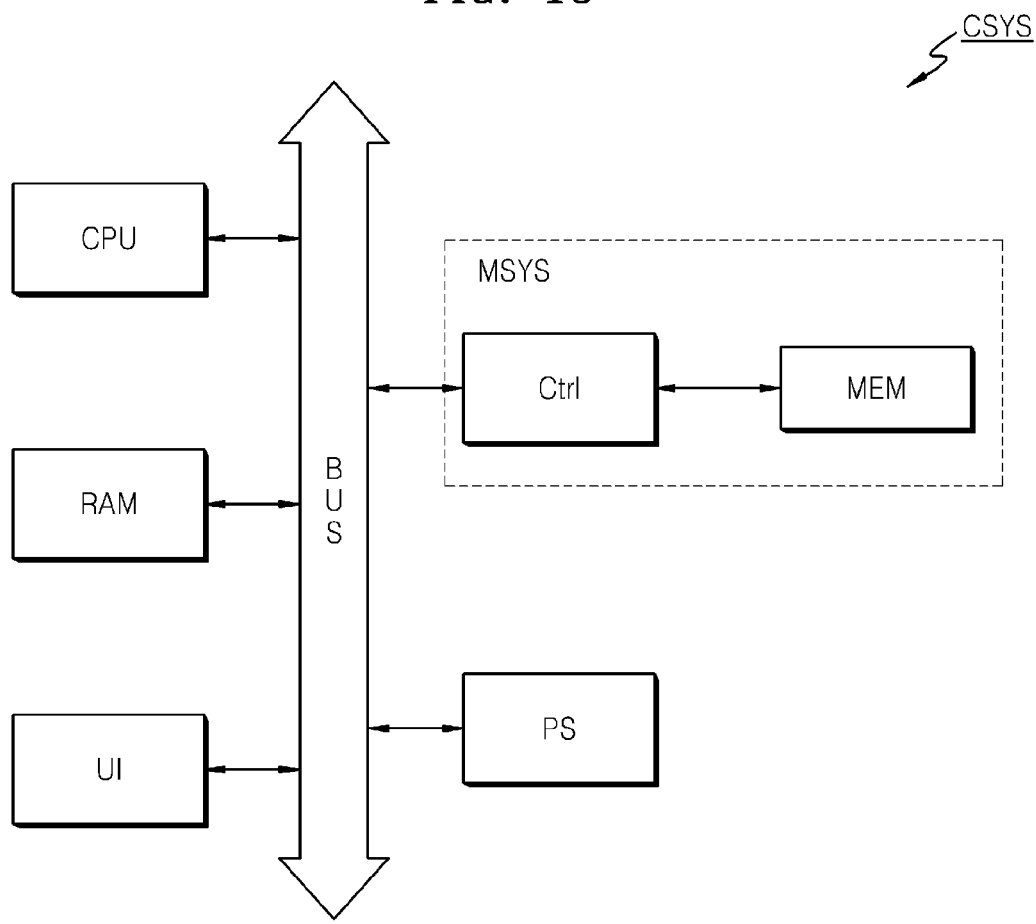
FIG. 15 is a block diagram illustrating a computing system according to an embodiment of the inventive concept.

FIG. 15 is a block diagram illustrating a computing system CSYS according to an embodiment of the inventive concept.

The computing system CSYS includes a processor CPU, a user interface UI, and a memory system MSYS that are electrically connected to a bus BUS. The memory system MSYS includes a memory controller Ctrl and a non-volatile memory device MEM. N-bit data (N is an integer equal to or greater than 1), which is or will be processed by the processor CPU, may be stored in the non-volatile memory device MEM through the memory controller Ctrl. The memory system MSYS of FIG. 15 may be the same as the non-volatile memory system 100 of FIG. 2. Therefore, according to the computing system CSYS, the read reliability of the non-volatile memory system 100 may be improved.

The computing system CSYS may further include a power supply device PS. Also, when the non-volatile memory device MEM is a flash memory device that performs a program operation by the program method of FIG. 2, the computing system CSYS may further include a non-volatile memory device (e.g., a random-access memory (RAM)).

When the computing system CSYS is a mobile device, the computing system CSYS may further include a battery for supplying an operation voltage of the computing system CSYS, and a modem such as a baseband chipset. Also, it will be apparent to those or ordinary skill in the art that the computing system CSYS may further include an application chipset, a camera image processor (CIS), and a mobile dynamic random-access memory (DRAM), and thus a detailed description thereof will be omitted herein.

Figure 16:
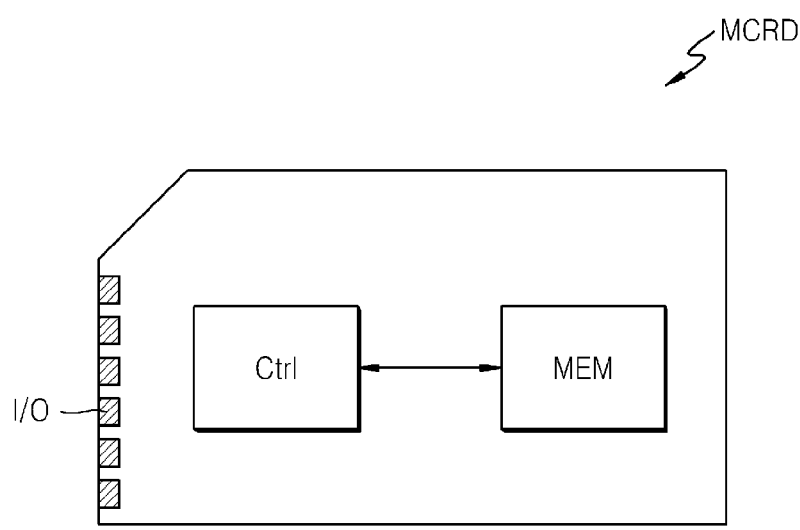
FIG. 16 is a block diagram illustrating a memory card according to an embodiment of the inventive concept.

FIG. 16 is a block diagram illustrating a memory card MCRD according to an embodiment of the inventive concept.

Referring to FIG. 16, the memory card MCRD includes a memory controller Ctrl and a non-volatile memory device MEM. In response to a request of an external host (not illustrated) received through an input/output unit I/O, the memory controller Ctrl controls writing/reading data into/from the non-volatile memory device MEM. Also, the memory controller Ctrl controls an erase operation on the non-volatile memory device MEM. In order to perform the above control operations, the memory controller Ctrl of the memory card MCRD may include a RAM and interface units (not illustrated) for interfacing with the external host and the non-volatile memory device MEM. The memory card MCRD may be implemented by the non-volatile memory system 100 of FIG. 2.

Also, the memory card MCRD may be implemented by a compact flash card (CFC), a microdrive, a smart media card (SMC), a multimedia card (MMC), a security digital card (SDC), a memory stick, or a USB flash memory driver. Therefore, according to the memory card MCRD of FIG. 16, the read reliability of the non-volatile memory system 100 may be improved, and system overhead may be reduced.

Figure 17:
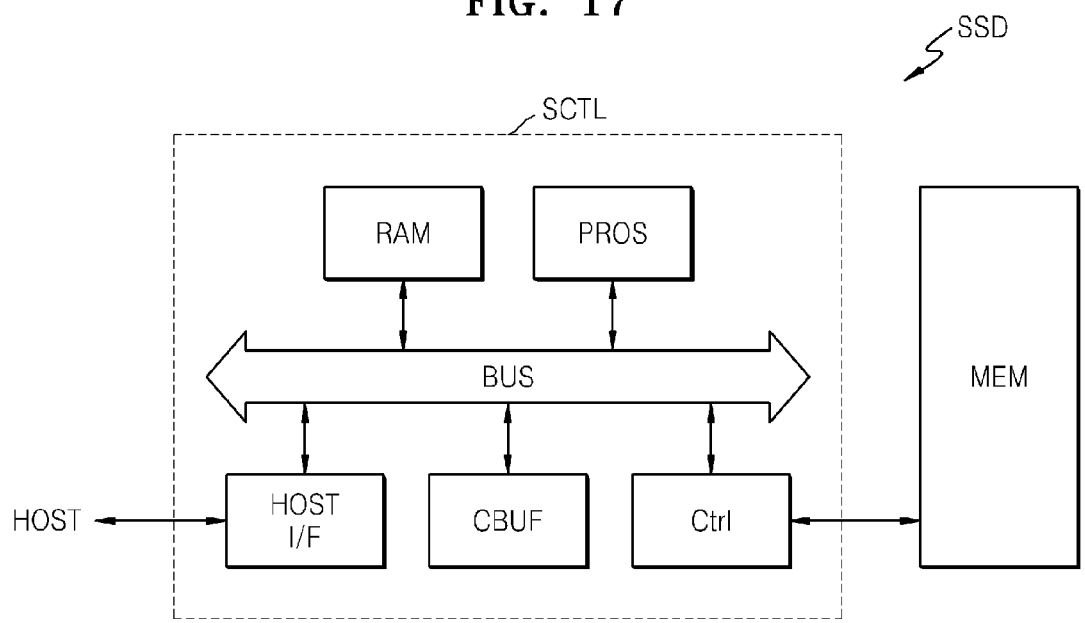
FIG. 17 is a block diagram illustrating a solid state drive (SSD) according to an embodiment of the inventive concept.

FIG. 17 is a block diagram illustrating a solid state drive SSD according to an embodiment of the inventive concept.

Referring to FIG. 17, the solid state drive SSD includes an SSD controller SCTL and a non-volatile memory device MEM. The SSD controller SCTL may include a processor PROS, a RAM, a cache buffer CBUF, and a memory controller Ctrl that are connected by a bus BUS. In response to a request (command, address, or data) of a host (not illustrated), the process PROS may control the memory controller Ctrl to communicate data with the non-volatile memory device MEM. The processor PROS and the memory controller Ctrl of the solid state drive SSD may be implemented by one ARM processor. Data necessary for an operation of the processor PROS may be loaded into the RAM.

A host interface HOST I/F receives and transmits a request of the host to the processor PROS, or receives and transmits data of the non-volatile memory device MEM to the host. The host interface HOST I/F may interface with the host through various interface protocols, such as Universal Serial Bus (USB), Man Machine Communication (MMC), Peripheral Component Interconnect-Express (PCI-E), Serial Advanced Technology Attachment (SATA), Parallel Advanced Technology Attachment (PATA), Small Computer System Interface (SCSI), Enhanced Small Device Interface (ESDI), and Intelligent Drive Electronics (IDE). Data, which will be transmitted to or is transmitted from the non-volatile memory device MEM, may be temporarily stored in the cache buffer CBUF. The cache buffer CBUF may be a static random-access memory (SRAM).

The solid state drive SSD may be implemented by the non-volatile memory system 100 of FIG. 2. Therefore, according to the solid state driver SSD of FIG. 17, read reliability may be improved, and a read speed may be increased.

Figure 18:
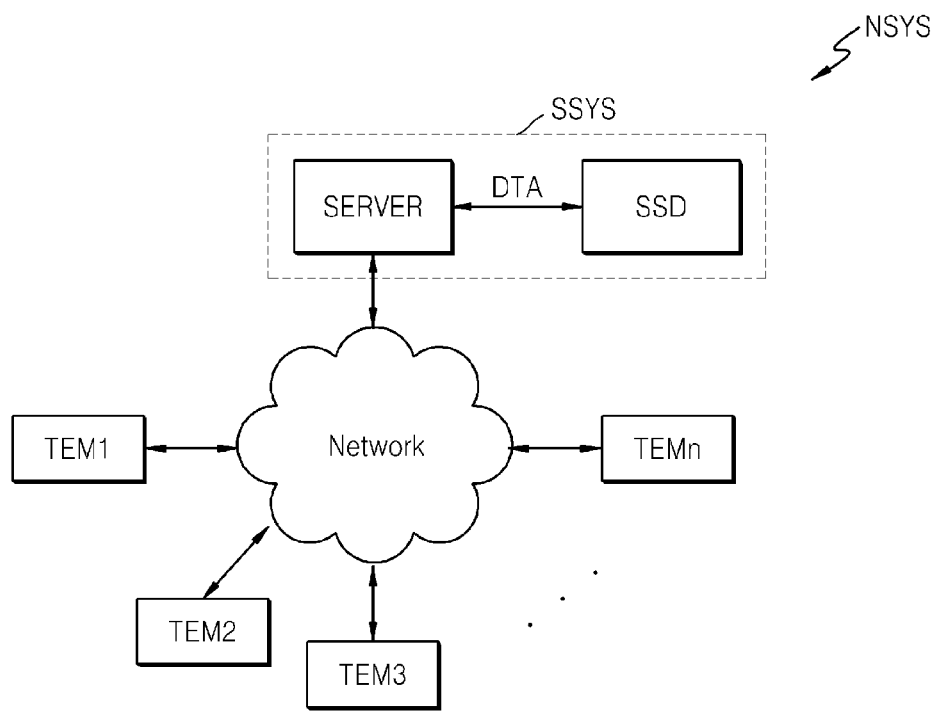
FIG. 18 is a block diagram illustrating a network system and a server system including an SSD according to an embodiment of the inventive concept.

FIG. 18 is a block diagram illustrating a network system NSYS and a server system SSYS including an solid state drive SSD, according to an embodiment of the inventive concept.

Referring to FIG. 18, the network system NSYS may include a server system SSYS and a plurality of terminals TEM1 to TEMn that are connected through a network. The server system SSYS may include a server SERVER that processes a request received from the terminals TEM1 to TEMn connected to the network, and a solid state drive SSD that stores data corresponding to a request received from the terminals TEM1 to TEMn. In this case, the solid state drive SSD of FIG. 18 may be the solid state drive SSD of FIG. 17. That is, the solid state drive SSD of FIG. 18 may include an SSD controller SCTL and a non-volatile memory device MEM, and the non-volatile memory device MEM may be a flash memory device that performs a read operation by the read method of FIG. 1.

While this inventive concept has been particularly shown and described with reference to exemplary embodiments thereof, it will be understood that various changes in form and details may be made therein without departing from the scope of the inventive concept as defined by the following claims.

What is claimed is:

1. A method of reading data in a memory system including a non-volatile memory device, the method comprising:
   reading first data stored in a first block of the non-volatile memory device using a first read scheme in response to a first read command, wherein the first read scheme is capable of detecting/correcting an error in the first data;
   upon determining an uncorrected error in the first data, setting the first block as a first temporary bad block, and reading second data stored in the first temporary bad block using a second read scheme different from the first read scheme in response to a second read command, wherein the second read scheme is capable of detecting/correcting an error in the second data;
   upon determining an uncorrected error in the second data, setting the first temporary bad block as a bad block; and
   reading the first data stored in the first block using one of the first read scheme and the second read scheme according to the setting of the first block in response to the second read command.

2. The method of claim 1, wherein the first read scheme is a hard decision scheme, and the second read scheme is a soft decision scheme.

3. The method of claim 1, further comprising:
   programming write data to the first temporary bad block only if a given percentage of the total data storage capacity of the non-volatile memory device is exceeded.

4. The method of claim 1, further comprising:
   reading the first data from the first temporary bad block only if a given percentage of total data storage capacity of the non-volatile memory device is exceeded.

5. The method of claim 1, further comprising:
   correcting an error in the second data using the second read scheme, and programming the corrected second data to the first temporary bad block; and
   reading the corrected second data from the first temporary bad block only if a given percentage of total data storage capacity of the non-volatile memory device is exceeded.

6. The method of claim 1, further comprising:
   correcting an error in the second data using the second read scheme; and thereafter,
   copying the corrected second data from the first block to a normal second block.

7. The method of claim 6, further comprising reading the corrected second data stored in the second block, in response to a second read command about the data stored in the first block set as the first temporary bad block.

8. The method of claim 1, wherein in response to a second read command about the data stored in the first block set as the first temporary bad block, the data stored in the first block is read by the second read scheme without reading the data stored in the first block by the first read scheme.

9. A memory system comprising:
   a non-volatile memory cell array including memory blocks that store data; and
   a memory controller configured to control operation of the non-volatile memory cell array,
   wherein the memory controller is configured to
   read first data stored in a first block of the non-volatile memory cell array using a first read scheme, the first read scheme is capable of detecting/correcting an error in the first data, and upon determining an uncorrected error in the first data, setting the first block as a first temporary bad block,
   read second data stored in the first temporary bad block using a second read scheme different from the first read scheme, the second read scheme is capable of detecting/correcting an error in the second data, and
   read the first data stored in the first block using one of the first read scheme and the second read scheme according to the setting of the first block.

10. The memory system of claim 9, wherein the first read scheme is a hard decision scheme, and the second read scheme is a soft decision scheme.

11. The memory system of claim 9, wherein the memory controller is further configured to program write data to the first temporary bad block only if a given percentage of total data storage capacity of the non-volatile memory cell array is exceeded.

12. The memory system of claim 9, wherein the memory controller is further configured to the first read data from the first temporary bad block only if a given percentage of total data storage capacity of the non-volatile memory cell array is exceeded.

13. The memory system of claim 9, wherein the memory controller is further configured to correct an error in the second data using the second read scheme, program the corrected second data to the first temporary bad block, and read the corrected second data from the first temporary bad block only if a given percentage of total data storage capacity of the non-volatile memory cell array is exceeded.

14. The memory system of claim 9, wherein the memory controller is further configured to correct an error in the second data using the second read scheme, and thereafter, copy the corrected second data from the first block to a normal second block.

15. The memory system of claim 9, wherein the non-volatile memory cell array comprises NAND flash memory.

* * * * *